United States Patent
Wada

[19]

[11] Patent Number: 6,084,809
[45] Date of Patent: Jul. 4, 2000

[54] MAIN AMPLIFIER CIRCUIT AND INPUT-OUTPUT BUS FOR A DYNAMIC RANDOM ACCESS MEMORY

[75] Inventor: Shoji Wada, Tokyo, Japan

[73] Assignees: Hitachi Ltd., Tokyo; Hitachi ULSI Engineering Corp., Kodaira, both of Japan

[21] Appl. No.: 08/988,689

[22] Filed: Dec. 11, 1997

Related U.S. Application Data

[63] Continuation of application No. 08/999,797, Jun. 16, 1997.
[60] Provisional application No. 60/022,168, Jul. 19, 1996.

[51] Int. Cl.$^7$ .................................................. G11C 7/00
[52] U.S. Cl. ............................ 365/203; 365/190; 365/205
[58] Field of Search ..................................... 365/203, 205, 365/190, 189.05, 189.09

[56] References Cited

U.S. PATENT DOCUMENTS

| | | | |
|---|---|---|---|
| 5,497,349 | 3/1996 | Nakai et al. | 365/230.03 |
| 5,553,029 | 9/1996 | Reohr et al. | 365/208 |
| 5,671,181 | 9/1997 | Hatsuda | 365/189.05 |
| 5,892,723 | 4/1999 | Tanaka et al. | 365/207 |
| 5,946,251 | 3/1999 | Sato et al. | 365/203 |

FOREIGN PATENT DOCUMENTS 235187 9/1995 Japan.

*Primary Examiner*—David Nelms
*Assistant Examiner*—Hien Nguyen
*Attorney, Agent, or Firm*—Haynes & Boone, L.L.P.

[57] ABSTRACT

A semiconductor memory is provided with a main amplifier circuit that is capable of selectively driving and precharging two I/O buses in conjunction with a write amplifier. The main amplifier circuit includes a separation and precharge section and an activation section. The activation section drives a signal for activating the first section to precharge the two I/O signals only when the two I/O buses are not being separated. The main amplifier circuit also includes both a main output bus and a test output bus. In so doing, the semiconductor memory can operate in a normal mode and a test mode. In the test mode, twice as many memory cells of the semiconductor memory can be accessed simultaneously, thereby reducing test time. The semiconductor memory, which can be one of many different data widths, has different sized output buses associated with each data width. Output buses with a relatively large capacitance can be produced with a large width, giving them a relatively small resistance. Conversely, output buses with a relatively small capacitance can be produced with a small width, giving them a relatively large resistance. As a result, a time constant for the output buses associated with each of the different widths is very similar.

11 Claims, 12 Drawing Sheets

6,084,809

MAIN AMPLIFIER CIRCUIT AND INPUT-OUTPUT BUS FOR A DYNAMIC RANDOM ACCESS MEMORY

CROSS REFERENCE

This application is a continuation-in-part of U.S. application Ser. No. 08/999,797 filed Jun. 16, 1997, which claims the benefit of U.S. Provisional Application Ser. No. 60/022,168 filed Jul. 19, 1996.

BACKGROUND OF THE INVENTION

The present invention relates generally to semiconductor design technology, and more particularly, to a system and method for providing an improved main amplifier and an input-output bus for use with a dynamic random access memory.

Speed and timing constraints have always been important considerations in designing electronic systems. Most system designs must match the timing requirements of all the components used, yet still be optimized for high speed. As a result, many integrated circuits, or "chips," utilize a synchronous design. A synchronous chip is one in which components of the chip are connected to a common system clock. Synchronous chips typically have latches, registers and/or counters connected to some of its inputs and outputs, all on a single monolithic chip. Furthermore, synchronous chips provide many benefits to system designers, such as fewer external logic chips and high speed operation.

One example of a synchronous chip is a synchronous dynamic random access memory ("SDRAM"). In concept, a SDRAM is simply a dynamic random access memory ("DRAM") with registers and/or latches included on the same chip. However, circuit and bus designs become more critical as the number of transistors and the speed of the transistors increase. For example, there exists conventional 16 Mbit SDRAMs (1 Mbit equals 1,048,576 memory cells, or "bits") as well as 64 Mbit DRAMs. However, presently, no 64 Mbit SDRAM exists. One convenient method for creating 64 Mbit SDRAMs is by combining the peripheral circuitry (circuits peripheral to a memory cell array) used in the 16 Mbit SDRAM with the memory array of the 64 Mbit DRAM. However, such a combination, due to higher operating speed required by the synchronous operation and heavier capacitive loads due to the increase in memory cells, creates a new set of problems. One such problem is timing conflicts. Timing conflicts may result in incorrect data being read and possibly making the device inoperable. Another problem is voltage level discrepancies. Voltage level discrepancies may result in signals being connected to different power supplies, thereby shorting the power supplies. As a result, power consumption is increased and reliability problems such as high temperature and current flow are prevalent.

To illustrate these problems, a 64 Mbit DRAM and a 16 Mbit SDRAM will be discussed. The 64 Mbit DRAM separates memory cells into a discrete number of banks. For the sake of example, four banks will be used. Associated with each of the banks of memory cells are a plurality of main amplifiers including a main amplifier circuit discussed below with reference to FIG. 1. Also associated with each of the banks of memory cells are a plurality of write amplifiers including a write amplifier circuit discussed below with reference to FIG. 2. Both the main amplifier and write amplifier are derived from the 16 Mbit SDRAM.

FIG. 1 describes a main amplifier circuit 10 for the 16 Mbit SDRAM. The main amplifier circuit 10 receives a plurality of signals including a bank activate signal MASJ, a main input-output separate signal MACBJ, a main amplifier activation signal MAEJ, a test signal MATESTB, and a main amplifier precharge signal MAPJ. The main amplifier also drives three signals: a main input-output signal MIOT, an inverted main input-output signal MIOB, and a main amplifier output MOJ. Furthermore, the main amplifier circuit 10 is connected to power supplies including a positive external power supply VDD, a negative external power supply VSS, and a positive power supply $V_1$. In the 16 Mbit SDRAM, the power supply $V_1$ is equal to VDD, but for reasons that will become more evident with the discussion below, for the present description, these two power supplies will be distinguished.

The main amplifier circuit 10 can be separated into four different sections. A first section, represented by a NAND gate 12, receives the two signals MASJ and MACBJ. The MASJ signal remains "high" whenever the main amplifier circuit 10 is "active". The main amplifier circuit 10 is active whenever it is being used to access a memory cell in its associated bank of memory cells. The MACBJ signal transitions "low" whenever the amplifier should be separating the two output signals MIOT and MIOB. Circuitry used to separate the two output signals is not shown, but different implementation of such circuitry are well known by those of ordinary skill in the art. Because the MASJ signal remains high, the NAND gate 12 has an output N1 that is an inverted signal of the MACBJ signal.

A second section of the main amplifier circuit 10 is a precharge circuit 14. The precharge circuit 14 precharges the output signals MIOB and MIOT by connecting them together and to VDD or $V_1$ for specific periods of time. Precharging is controlled by the MAPJ signal when the two output signals MIOT and MIOB are not being separated, and by the MASJ signal when the bank associated with the main amplifier circuit 10 is not active.

A third section of the main amplifier circuit 10 is a flip flop 16. The flip flop 16 receives the N1 signal as well as a signal N2 derived from the precharge circuit 14. The flip flop 16 produces two output signals N3 and N4.

A fourth section of the main amplifier circuit 10 is a drive circuit 18. The drive circuit 18 receives the outputs N3 and N4 of the flip flop 16 to selectively drive an output signal MOJ of a main output bus.

In addition, the drive circuit 18 receives the MATESTB signal, which signifies that the main amplifier circuit 10 is in a test mode. The test mode is used during production testing of the 16 Mbit SDRAM to shorten test times. To test the 16 Mbit SDRAM, each memory cell must be accessed. Utilizing a test mode allows more than one memory cell to be written to and read from at the same time, thereby reducing the test time. The 16 Mbit SDRAM has 16 MOJ signals grouped to form the main output bus, in order to facilitate a 16 bit wide SDRAM. Furthermore, the 16 Mbit SDRAM has 16 main amplifier circuits. Therefore, the 16 Mbit SDRAM may simultaneous access sixteen memory locations, thereby improving the test time. In order to improve test times further, it would be advantageous to access more than 16 memory cells at the same time.

FIG. 2 describes a write amplifier circuit 20 for the 16 Mbit SDRAM. The write amplifier circuit 20 receives a plurality of signals including a first precharge signal MIPTIJ, a second precharge signal MIPBIJ, an equalization signal MIEQIJ, a first write signal MDIB, and a second write signal MDIT. The write amplifier circuit 20 also drives the main and inverted input-output signals MIOT and MIOB.

Furthermore, the write amplifier circuit 20 is connected to the negative external power supply VSS and a positive internal power supply $V_1$, which equals VDD.

The write amplifier circuit 20 can equalize the output signals MIOB and MIOT by connecting them together and/or to $V_1$ for specific periods of time. Furthermore, the write amplifier circuit 20 can selectively drive the output signals MIOB and MIOT to either $V_1$ or VSS by appropriately asserting the write signals MDIB, MDIT, MIPBIJ, or MIPTIJ.

The 64 Mbit DRAM has a memory array that operates at an intermediate voltage level, which is between VDD and VSS. The intermediate voltage level is required for a variety of reasons, well known by those of ordinary skill in the art. A problem arises when the above two amplifier circuits from the 16 Mbit SDRAM, which operate at VDD and VSS, are combined with the 64 Mbit memory cell array which requires the intermediate voltage. A first solution is to change the voltage level for VDD. However, this solution does not work because other peripheral circuits, as well as other peripheral chips, require the voltage level for VDD to be at a higher, predefined level. A second solution is to change the positive internal power supply $V_1$ to be equal to the intermediate voltage level. In this way, the voltage level for VDD remains the same, and the intermediate voltage level for the memory array is reduced. However, this solution creates a new set of problems, as discussed below.

FIG. 3 shows a timing diagram representing the signals and circuits discussed above, and illustrating an example of the problems caused by the different voltage levels VDD and $V_1$. The functionality of the input signals is basically a function of other circuits included with the 16 Mbit SDRAM, but not shown. It is understood, however, that one of ordinary skill in the art will be familiar with the input signals and their accompanying waveform, with reference to the signal descriptions provided above.

The waveform for the N1 signal is basically an inversion of the waveform for the MACBJ signal whenever the main amplifier circuit 10 is activated (MASJ is high), as shown by the reference arrows 22, 24, 26, 28. In so doing, the N1 signal simply notifies the main amplifier circuit 10 when separation is to occur. The main amplifier is capable of driving the output signals MIOB and MIOT, referenced generally by MIOx, whenever the N1 signal is low. Therefore, referring to the reference arrows 30, 32 and 34, when the MAPJ signal is low, the main amplifier circuit 10 drives the MIOx signals to VDD. Likewise, referring to the reference arrows 36 and 38, the write amplifier circuit 20 also drives the MIOx signals to $V_1$ or VSS at specific times. However, during times 40 and 42, both the main amplifier circuit 10 and the write amplifier circuit 20 are driving the MIOx signals at the same time but to different voltage levels. Since the MIOx signals will not be at two different voltages at the same time, a "short" exists, for a limited period of time, between the corresponding power supplies. In order to improve the reliability and power consumption of the 64 Mbit SDRAM, it would be advantageous to eliminate any shorts between the power supplies.

SUMMARY OF THE INVENTION

The present invention, accordingly, provides a semiconductor memory with a main amplifier circuit that is capable of utilizing two different positive voltage levels and selectively driving and precharging two I/O buses in conjunction with a write amplifier. The main amplifier circuit includes a separation and precharge section and an activation section. The activation section drives a signal for activating the first section to precharge the two I/O signals only when the two I/O buses are not being separated.

In another aspect, the main amplifier circuit includes both a main output bus and a test output bus. In so doing, the semiconductor memory can operate in a normal mode and a test mode. In the test mode, twice as many memory cells of the semiconductor memory can be accessed simultaneously, thereby reducing test time.

In another aspect, the semiconductor memory, which can be one of many different data widths, has different sized output buses associated with each data width. Since the different data widths are generated using different metal masks, the different sized output buses can be generated with the same metal masks. Output buses with a relatively large capacitance can be produced with a large width, giving them a relatively small resistance. Conversely, output buses with a relatively small capacitance can be produced with a small width, giving them a relatively large resistance. As a result, a time constant for the output buses associated with each of the different widths is very similar.

BRIEF DESCRIPTION OF THE DRAWINGS

FIG. 2 is performed.

DETAILED DESCRIPTION OF THE PREFERRED EMBODIMENT

Figure 2:
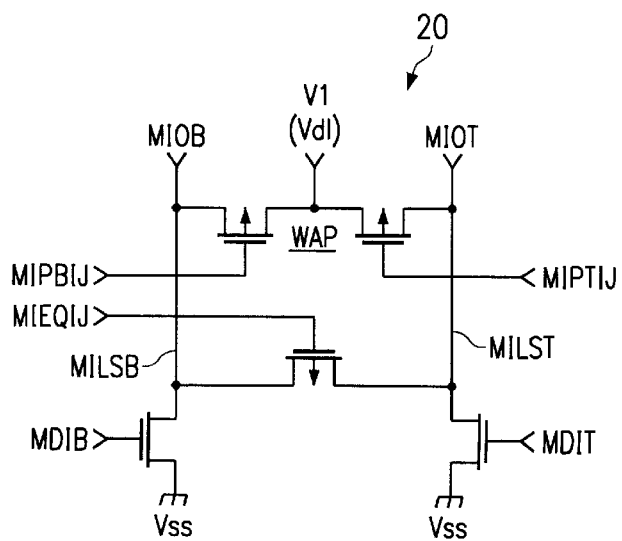
FIG. 2 is a schematic diagram of a circuit of a write amplifier for a 16 Mbit SDRAM.
Figure 3:
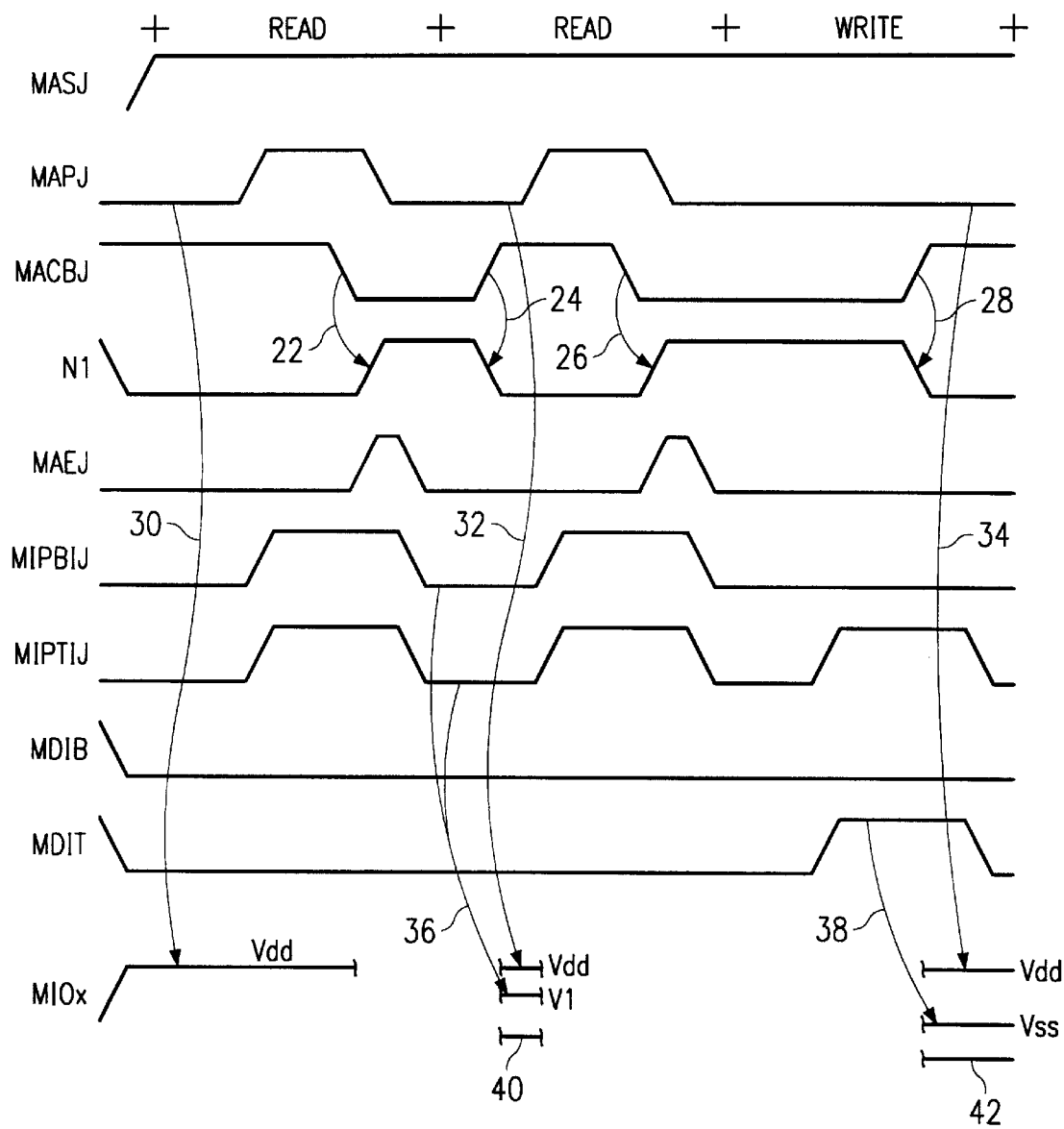
FIG. 3 is a timing diagram of the circuits of FIGS. 1–2.

As described above, FIGS. 1, 2 and 3 illustrate circuits and timing diagrams associated with a main amplifier and write amplifier for a 16 Mbit SDRAM device. The write amplifier circuit 20 of FIG. 2 is also utilized by the present invention and is therefore referenced in the following description.

Figure 4:
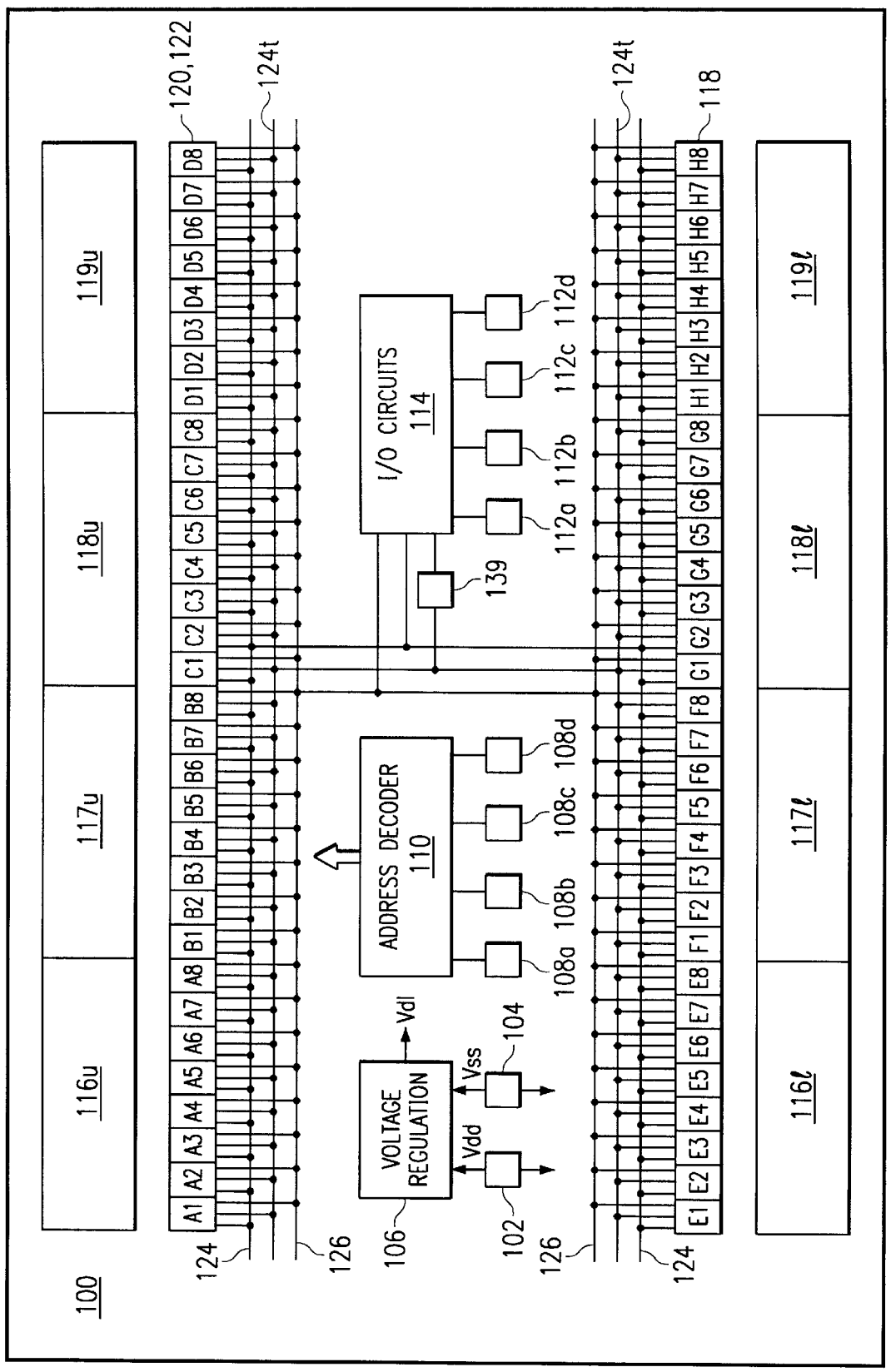
FIG. 4 is a block diagram of a 64 Mbit SDRAM embodying features of the present invention.

Referring to FIG. 4, the reference numeral 100 designates, in general, an SDRAM device embodying features of the present invention. While in a preferred embodiment of the invention, the device 100 is a 64 Mbit SDRAM, it should be understood that the present invention is not limited to use with a SDRAM, but may be used in conjunction with any array-type integrated circuit device requiring multiple-amplifiers with different positive voltage levels, including other types of random access memories. Furthermore, the voltage levels listed in the preferred embodiment are for descriptive purposes only, and are not intended to limit the invention.

The device 100 receives a positive external power supply (VDD) and a negative external power supply (VSS) through input pads 102 and 104, respectively. In the preferred embodiment, the VDD voltage equals 3.3V and the VSS voltage equals 0V. Furthermore, the device 100 comprises a voltage regulator 106 that supplies an internal voltage (VDL) of about 2.2V, for use with memory cells of the device. All three voltages VSS, VDD, VDL are typical for most conventional 64 Mbit DRAMs, and will not be discussed in greater detail.

The device 100 receives address inputs and control signal inputs through input pads 108a, 108b, 108c, and 108d. In the preferred embodiment, many more address and control input pads exist, but their functionality can be illustrated by the pads 108a–108d. Furthermore, the device 100 comprises a plurality of control and address decoder circuits, referenced generally by an address decoder group 110. The address decoder group 110 and the input pads 108a–108d are conventional for most 64 Mbit DRAMs and/or 16 Mbit SDRAMs, and will not be discussed in greater detail.

The device 100 transmits and receives data input-outputs (I/Os) through I/O pads 112a, 112b, 112c, and 112d. The number of I/Os determines a data width for the device 100, which is typically either four, eight or sixteen bits wide. Unless otherwise stated, for the sake of example, the device 100 is a four bit wide device, having only the four I/O pads 112a–112d. Furthermore, the device 100 comprises a plurality of input buffers, output buffers and other circuits, referenced generally by an I/O circuits group 114. The I/O circuits group 114 and the input pads 112a–112d are conventional for most 64 Mbit DRAMs and/or 16 Mbit SDRAMs, and will not be discussed in greater detail.

The device 100 contains 64 Meg (1 meg equals 1,048, 576) of memory cells. The memory cells operate at voltage levels between 0V (VSS) and 2.2V (VDL). The memory cells are grouped into four equal-sized banks 116, 117, 118, 119, each having an upper and lower portion represented by the suffix "u" or "l", respectively. The memory cells are conventional, and utilize many different signal lines, amplifier circuits and decoder circuits. Because the banks 116–119 contain memory cells conventional for most 64 Mbit DRAMs, their functionality will not be discussed in greater detail.

Also associated with each bank of memory cells is a plurality of main amplifier and write amplifier circuits. In the device 100, there are 8 main amplifiers and 8 write amplifiers associated with each bank portion. For example, the bank portion 116u has associated with it a first main amplifier 120 and a first write amplifier 122, referenced generally by a group A1, and seven other main amplifiers and write amplifiers referenced generally by groups A2, A3, A4, A5, A6, A7, A8. Likewise, each of the bank portions 117u, 118u, 119u, 116l, 117l, 118l, and 119l have eight main amplifiers and write amplifiers, referenced generally by groups B1–B8, C1–C8, D1–D8, E1–E8, F1–F8, G1–G8, and H1–H8, respectively. All of the main amplifiers and all of the write amplifiers are identical, and for the sake of simplicity, only the first main amplifier 120 and the first write amplifier 122 will be further discussed, it being understood that the remaining main amplifiers and write amplifiers perform in the same way.

Each of the main amplifiers is connected to a main output bus 124 and each of the write amplifiers is connected to a data-in bus 126. As mentioned above, the device 100 may have either four, eight or sixteen I/Os. Accordingly, the output bus 124 and the data-in bus 126 each comprise either four, eight or sixteen individual bus lines, respectively.

Figure 1:
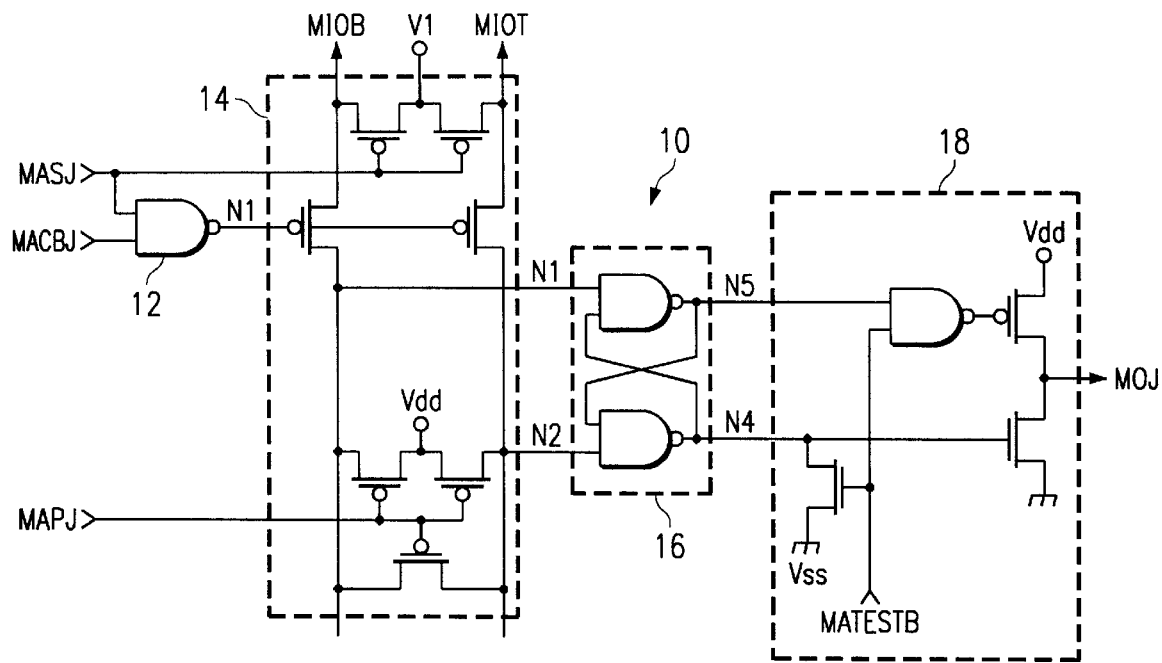
FIG. 1 is a schematic diagram of a circuit of a main amplifier for a 16 Mbit SDRAM.
Figure 5:
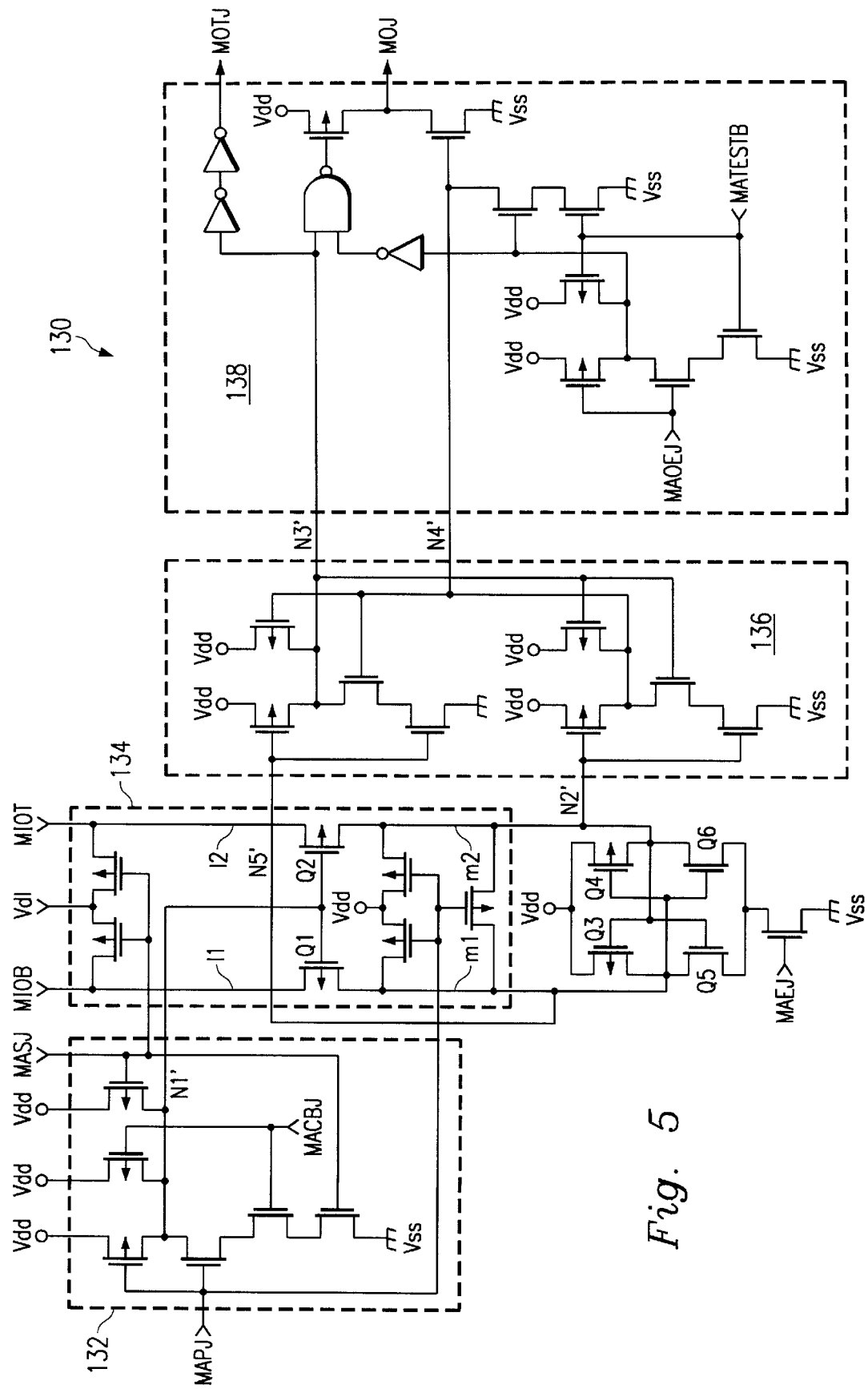
FIG. 5 is a schematic diagram of a circuit of an improved main amplifier for the 64 Mbit SDRAM of FIGS. 4 and 9.

Referring to FIG. 5, an improved main amplifier circuit 130 of the first main amplifier 120 utilizes the same plurality of signals as the main amplifier circuit 10 of FIG. 1. These include the bank activate signal MASJ, the main input-output separate signal MACBJ, the main amplifier activation signal MAEJ, the test signal MATESTB, the main amplifier precharge signal MAPJ, the main input-output signal MIOT, the inverted main input-output signal MIOB, and the main amplifier output MOJ. Furthermore, the main amplifier circuit 130 is also connected to the VDD, VDL and VSS power supplies.

The main amplifier circuit 130 can be separated into four different sections. A first section is a NAND circuit 132. The NAND circuit 132 receives the three signals MAPJ, MASJ and MACBJ. The MACBJ signal transitions low whenever the amplifier circuit 130 should be separating the two output signals MIOT and MIOB. The MASJ signal transitions high whenever the bank portion 116u is activated. The MAPJ signal transitions high whenever the output signals MIOT and MIOB are to be precharged. As a result, the NAND circuit 132 has an output N1' that is responsive to both the separation signal MACBJ as well as the precharge signal MAPJ. The benefits of the improved NAND circuit 132 will become more evident with the following discussion.

A second section of the main amplifier circuit 130 is a precharge circuit 134. The precharge circuit 134 precharges the output signals MIOB and MIOT by connecting them together and to VDD for specific periods of time as well as to VDL for different periods of time. Precharging to VDD is controlled by the signal MAPJ and only occurs when the two output signals MIOT and MIOB are not being separated, i.e., when N1' is low. Precharging to VDL is controlled by the signal MASJ and only occurs when the bank portion 116u is activated.

A third section of the main amplifier circuit 130 is a flip flop 136. The flip flop 136 receives a signal N5' as well as a signal N2' derived from the precharge circuit 134. The flip flop 136 produces two output signals N3' and N4'.

A fourth section of the main amplifier circuit 130 is a drive circuit 138. The drive circuit 138 receives the outputs N3', N4' of the flip flop 136 to selectively drive the MOJ signal of the main output bus.

The drive circuit 138 also receives the signal MATESTB, which signifies that the main amplifier circuit 130 is in the test mode, and an output activate signal MAOEJ to drive the MOJ signal. Utilizing these two signals, and the outputs N3', N4', the drive circuit 138 can selectively drive either the MOJ bus or a main amplifier test output bus MOTJ. The MOTJ signal is similar to the MOJ bus, but is only used during test mode. Because there are 64 main amplifier circuits, 32 associated with upper portion banks 116u, 117u, 118u, 119u and 32 associated with the lower portion banks 116l, 117l, 118l, 119l, a main test output bus 124t comprises 64 buses for the individual MOTJ buses associated with each main amplifier circuit. In so doing, during test mode, 64 memory cells may be simultaneously accessed. Without using the MOTJ signal and operating in a normal mode, a maximum of sixteen memory cells (in the case of the sixteen bit wide device 100) may be accessed simultaneously. As a result, the time required to access all 64 meg of memory cells is reduced by a factor of four when operating in test mode. To further facilitate the test mode, the main test output bus 124t is connected to compression and decompression circuits 139, to determine if data from all the memory cells being simultaneously read is correct. It is understood that such compression and decompression circuits are used in the conventional 16 Mbit SDRAM and are readily evident and easily understood by those of ordinary skill in the art.

As mentioned above, the first write amplifier 122 includes the write amplifier circuit 20 of FIG. 2. However, the voltage $V_1$ is connected to the $V_{DL}$ power supply, describe above.

Figure 6:
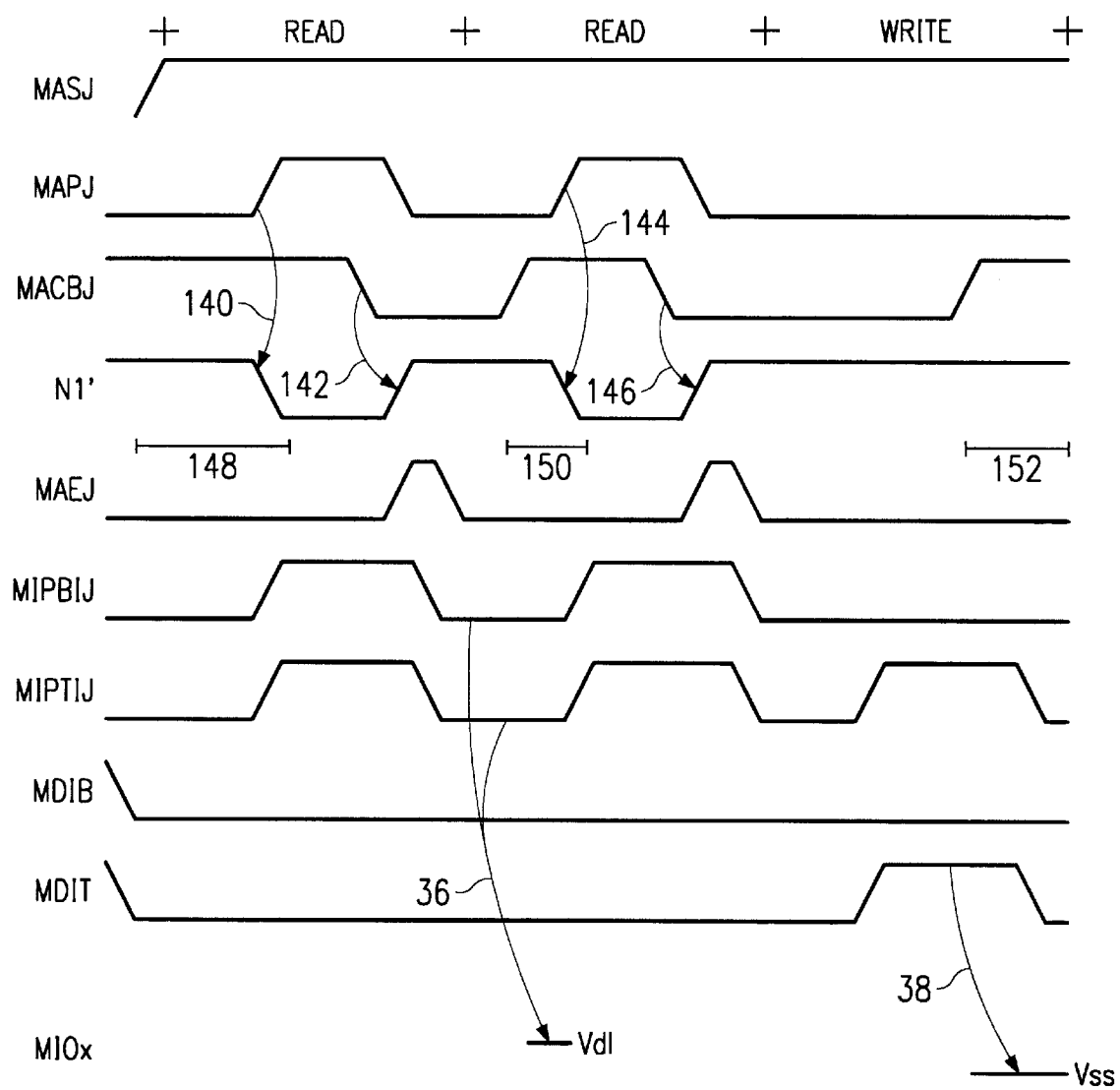
FIG. 6 is a timing diagram of the improved main amplifier circuit of FIG. 5, along with the write amplifier of FIG. 2, illustrating the features of the present invention.

Referring to FIG. 6, the waveforms of the various input signals are functions of other circuits located on the device 100, but not shown. It is understood, however, that many of these input signals are similar to those of the 16 Mbit SDRAM and one of ordinary skill in the art will be familiar with the input signals and their accompanying waveform, with reference to the signal descriptions provided above.

The waveform for the signal N1' is a function of both the MACBJ and MAPJ signals, as shown by the reference arrows 140, 142, 144, 146, whenever the main amplifier circuit 130 is enabled (MASJ is high). In so doing, N1' notifies the main amplifier circuit 130 both when separation is to occur as well as when precharging is not occurring. The main amplifier 130 is capable of driving the output signals MIOB and MIOT, referenced generally by MIOx, to $V_{DD}$ whenever the N1' signal is low. Therefore, since the MAPJ signal controls the N1' signal, the main amplifier circuit 130 does not drive the MIOx signals to $V_{DD}$ during time periods 148, 150 and 152.

The write amplifier circuit 20 continues to drive the MIOx signals to $V_{DL}$ or $V_{SS}$ at specific times, as shown by reference arrows 36 and 38. However, no short exists due to conflicting voltages being driven onto the MIOx signals.

Referring again to FIG. 4, the device 100 can be either four, eight or sixteen bits wide, hereinafter referred to as the by-4, by-8 or by-16 version, respectively. During production of the device, a determination of which version of the device 100 is made. Although the device 100 is produced using a plurality of mask layers (not shown), each version has associated therewith a unique metal mask layer (also not shown). It is understood that this method of producing different versions of a device by changing only one metal mask layer is well known in the art, and will therefore not be discussed in greater detail.

The particular version of the device 100 determines the number of bus lines in the output bus 124 and the data-in bus 126. In the case of the by-4 version, there are four bus lines in the output bus 124, two associated with the upper portion banks 116u, 117u, 118u, 119u and two associated with the lower portion banks 116l, 117l, 118l, 119l. In the case of a by-8 version, there are eight bus lines in the output bus 124, four associated with the upper portion banks 116u, 117u, 118u, 119u and four associated with the lower portion banks 116l, 117l, 118l, 119l. In the case of a by-16 version, there are sixteen bus lines in the output bus 124, eight associated with the upper portion banks 116u, 117u, 118u, 119u and eight associated with the lower portion banks 116l, 117l, 118l, 119l. The arrangement and quantity of bus lines in the data-in bus 126 are similar to those of the output bus 124.

The version of the device 100 also determines the number of amplifier groups A1–A8, B1–B8, C1–C8, D1–D8, E1–E8, F1–F8, G1–G8, H1–H8 that are connected to a single bus line of the main output bus 124 or main data-in bus 126. In the case of the by-4 version, there are sixteen amplifier groups that are connected to a single bus line. Because the banks 116, 117, 118, 119 are separated into upper and lower levels, all of the sixteen amplifier groups on a single bus line will be in the same level. For a first example, a memory access to the by-4 version of the device 100 will activate one main amplifier from the groups A1, A3, A5, A7, B1, B3, B5, B7, C1, C3, C5, C7, D1, D3, D5, D7, although a main amplifier in each of the groups is connected to the same bus line. In a second example, a memory access for the by-4 version of the device 100 will activate one main amplifier from the groups E2, E4, E6, E8, F2, F4, F6, F8, G2, G4, G6, G8, H2, H4, H6, H8, although a main amplifier in each of the groups is connected to the same bus line.

In the case of a by-8 version of the device 100, there are eight amplifier groups that are connected to a single bus line. Because the banks 116, 117, 118, 119 are separated into upper and lower levels, all of the eight amplifier groups on a single bus line will be in the same level. For a first example, a memory access to the by-8 version of the device 100 will activate one main amplifier from the groups A1, A5, B1, B5, C1, C5, D1, D5, although a main amplifier in each of the groups is connected to the same bus line. In a second example, a memory access for the by-8 version of the device 100 will activate one main amplifier from the groups E2, E6, F2, F6, G2, G6, H2, H6, although a main amplifier in each of the groups is connected to the same bus line.

In the case of a by-16 version of the device 100, there are four amplifier groups that are connected to a single bus line. Because the banks 116, 117, 118, 119 are separated into upper and lower levels, all of the four amplifier groups on a single bus line will be in the same level. For a first example, a memory access for the by-16 version of the device 100 will activate one main amplifier from the groups A1, B1, C1, D1, although a main amplifier in each of the groups is connected to the same bus line. In a second example, a memory access for the by-16 version of the device 100 will activate one main amplifier from the groups E4, F4, G4, H4, although a main amplifier in each of the groups is connected to the same bus line.

Due to the different numbers of amplifier groups being simultaneously connected to a single bus line for the by-4, by-8 and by-16 versions of the device 100, the capacitive load on the main output bus 124 is different for each version. In the by-4 version, the capacitive load caused by the sixteen connected main amplifiers is relatively high, while in the by-16 version, the capacitive load caused by the four connected main amplifiers is relatively low. This discrepancy in capacitance causes several problems. One problem occurs in the I/O circuits 114. Because both the by-4 version and the by-16 version share all the same mask layers except for one, the I/O circuits 114 for each version is practically the same. However, because the main output bus 124 has different capacitive loads for the different versions, the signals being driven to the I/O circuits 114 arrive at different times. As a result, errors may occur in the I/O circuits due to the signal discrepancies between the versions. Another problem is that the by-4 version, in general, may operate slower than the by-8 and by-16 versions.

Figure 7A:
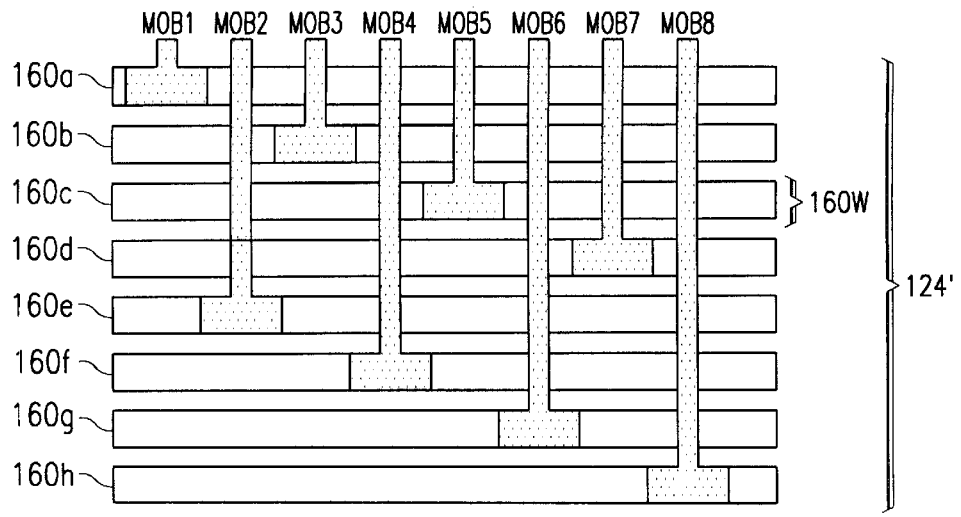
FIGS. 7a, 7b and 7c are layout diagrams for a main output bus of the 64 Mbit SDRAM of FIGS. 4 and 8.
Figure 7B:
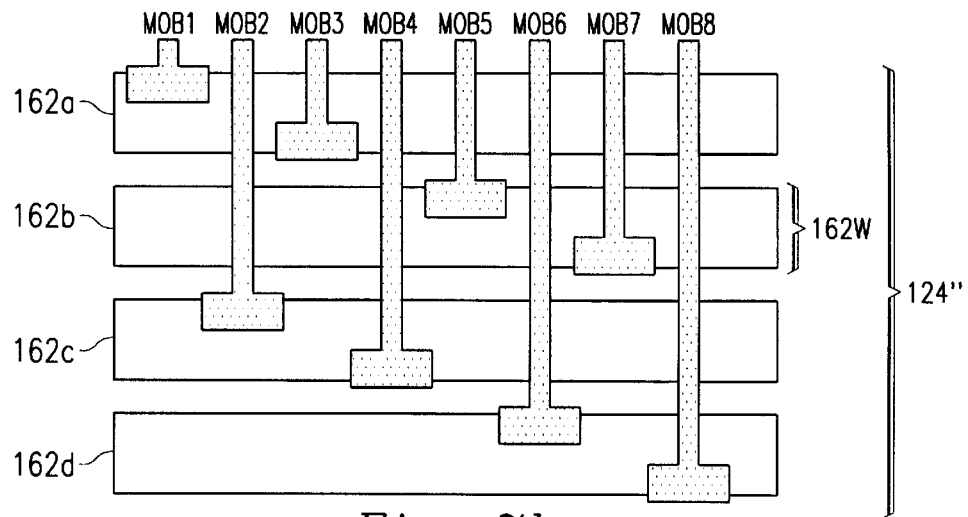
Figure 7C:
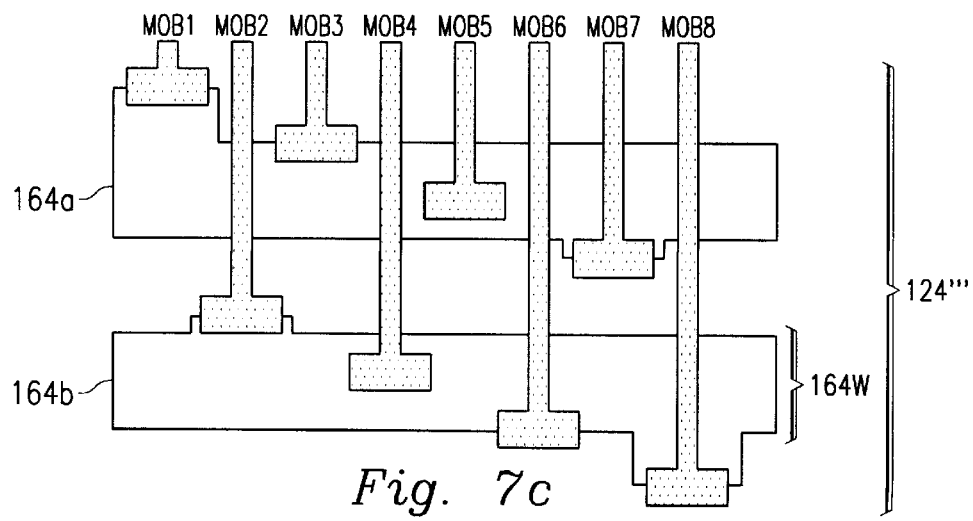

These problems are resolved by not only changing the number of bus lines in the main output bus 124 for the different versions, but also changing the width of the bus lines. Referring to FIGS. 7a–7c, a portion of the main output bus 124 used with the upper bank portion 117u and the main amplifiers in groups B1, B2, B3, B4, B5, B6, B7, B8 is shown. Because each main amplifier has an output of MOJ (FIG. 5), the different main amplifier outputs are referenced by numerals MOB1, MOB2, MOB3, MOB4, MOB5, MOB6, MOB7, MOB8 corresponding to the MOJ outputs of the main amplifier circuits in groups B1, B2, B3, B4, B5, B6, B7, B8, respectively. Furthermore, it is understood that the bank portion 117u is merely representative of each of the bank portions and their connection to the main output bus 124. Also, because the main output bus 124 is different for each version, it will be hereinafter referred to with the numerals 124', 124", and 124'" for the by-16, by-4, and by-8 versions, respectively.

FIG. 7a illustrates the main output bus 124' with eight bus lines 160a, 160b, 160c, 160d, 160e, 160f, 160g, 160h, as used in the by-16 version of the device 100. Each of the eight bus lines 160a–160h is of a specific width 160w. Furthermore, each of the main amplifier outputs MOB1, MOB2, MOB3, MOB4, MOBS, MOB6, MOB7, MOB8 is connected to one of the eight bus lines 160a–160h. The main amplifier outputs MOB1, MOB2, MOB3, MOB4, MOB5, MOB6, MOB7, MOB8 are constructed using one of the metal mask layers that is consistent for each version. As a result, the main amplifier outputs are the same for each version of the device 100. Furthermore, the main amplifier outputs MOB1, MOB2, MOB3, MOB4, MOB5, MOB6, MOB7, MOB8 are connected to the bus lines 160a–160h using conventional through-hole technology.

FIG. 7b illustrates the main output bus 124" with four bus lines 162a, 162b, 162c, 162d, as used in the by-8 version of the device 100. Each of the four bus lines 162a–162d is of a specific width 162w, such that 162w>160w. Furthermore, each of the main amplifier outputs MOB1, MOB2, MOB3, MOB4, MOBS, MOB6, MOB7, MOB8 is connected to one of the four bus lines 162a–162d. Because the main amplifier outputs MOB1, MOB2, MOB3, MOB4, MOB5, MOB6, MOB7, MOB8 are constant for each version of the device 100, the width 162w of the bus lines 162a–162d is also sufficiently large to overlap the appropriate main amplifier outputs, as shown.

FIG. 7c illustrates the main output bus 124'" with two bus lines 164a, 164b, as used in the by-4 version of the device 100. Each of the two bus lines 164a–164b is of a specific width 164w, such that 164w>162w>160w. Furthermore, each of the main amplifier outputs MOB1, MOB2, MOB3, MOB4, MOB5, MOB6, MOB7, MOB8 is connected to one of the two bus lines 164a–164b. As discussed above with reference to FIG. 7b, because the main amplifier outputs MOB1, MOB2, MOB3, MOB4, MOB5, MOB6, MOB7, MOB8 are constant for each version of the device 100, the width 164w of the bus lines 164 is also sufficiently large to overlap the appropriate main amplifier outputs, as shown.

By providing a bus width that varies between the different versions of the device 100, a time delay caused by the difference in capacitance between the versions is equalized. The time delay is determined by an RC constant of the bus lines of the main output bus 124, where R represents the resistance of each bus line, and C represents the capacitance of each bus line. By making the bus lines wider, the resistance of each bus lines is decreased. In this way, the R for the bus lines 164a–164b of the by-4 version is relatively small, while the C for the bus lines is relatively large. Conversely, the R for the bus lines 160a–160h of the by-16 version is relatively large, while the C for the bus lines is relatively small. As a result, the time delay, or RC constant, for the bus lines in each version of the device 100 are very similar, and the signal performance on the bus lines of the different versions is more consistent.

Figure 8:
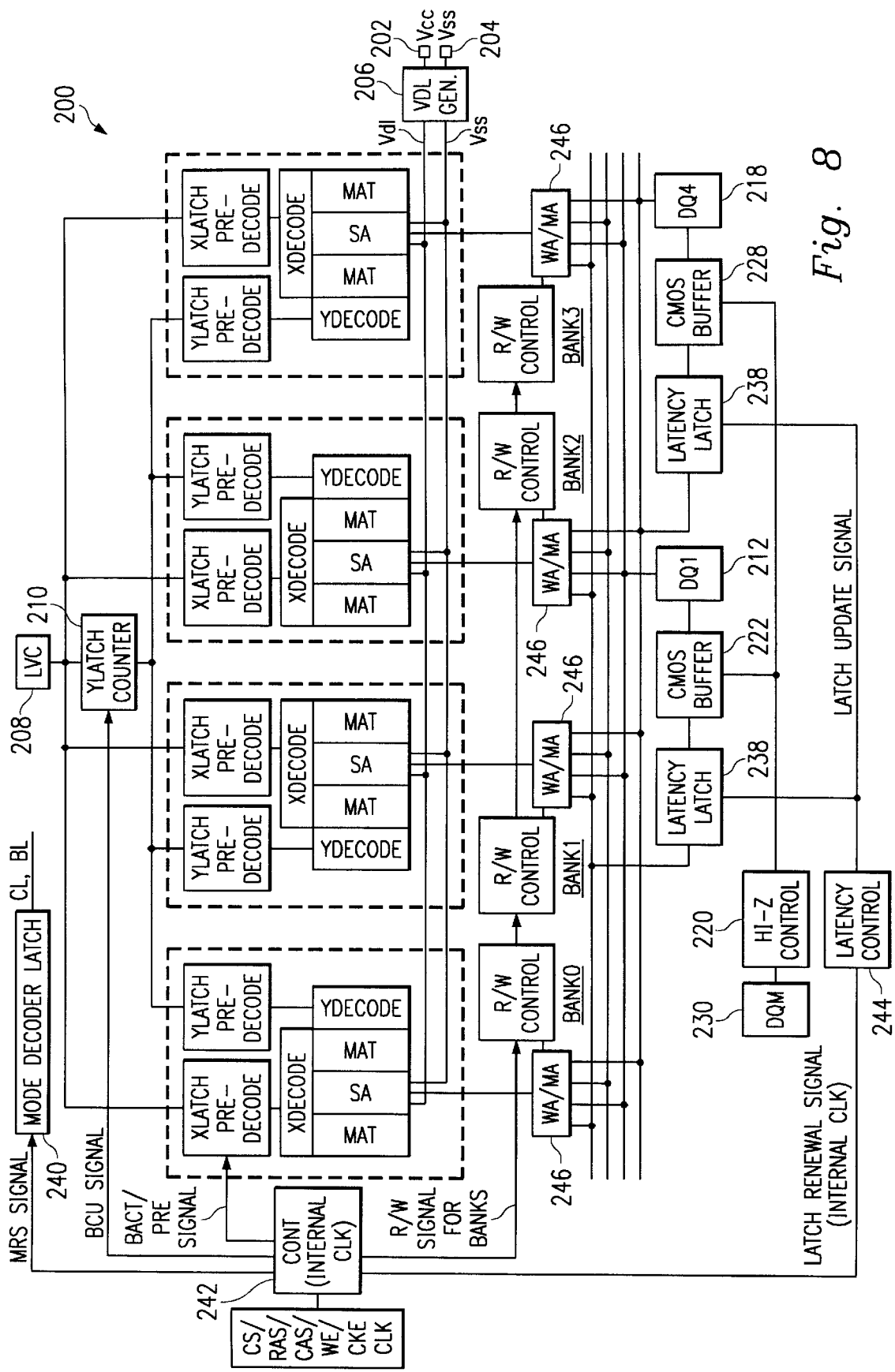
FIG. 8 is a block diagram of another 64 Mbit SDRAM embodying features of the present invention.

Referring to FIG. 8, a device 200 represents another embodiment of an SDRAM to which the present invention is applied. The device 200 is a 64M SDRAM comprising four banks BANK0–BANK3, each having an X-latch predecoder, an X-decoder, a Y-latch predecoder, a Y-decoder, a memory array and a sense amplifier.

Figure 9:
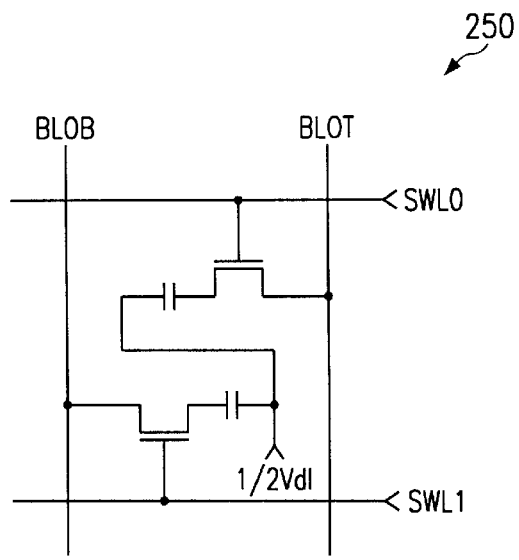
FIG. 9 is a schematic diagram of a single memory cell of the 64 Mbit SDRAM of FIG. 8.

The device 200 receives external power supplies VDD and VSS through input pads 202, 204. The external power supply VDD is about 3.3 V and the external power supply VSS is about 0 V. The device 200 has memory cells as shown in FIG. 9 and also includes a voltage regulator VDL GEN 206 that supplies an internal power supply VDL of approximately 2.2 V.

The device 200 receives address signals through a plurality of address input pads (not shown). The address signals are fed to the banks BANK0–BANK3 through an address first-stage circuit LVC 208 that converts an LVTTL voltage level to a CMOS, or in-chip, voltage level. A Y-latch counter 210 latches an address signal received in a burst mode and updates the address signal by the counter. The LVC 208 and Y-latch counter 210 may be conventional circuits.

The device 200 reads or writes data through I/O pads (also not shown). The voltage levels of the data to be written or read is changed by data first-stage circuits DQ0–DQ3 212, 218 to a LVTTL level, a CMOS level or another predetermined level. The data first-stage circuits 212, 218 are connected to CMOS input/output buffers CMOS buff 222, 228, respectively, which are controlled by a high-impedance control circuit Hi-Z Control 220. Although not shown, the Hi-Z Control 220 performs the level change of a control signal inputted from external circuits, similar to the address first-stage circuit 208 and the data first-stage circuits 212, 218. The high-impedance control circuit Hi-Z control 220 is controlled by a mask control circuit DQM 230 that outputs an internal control signal. The data input/output buffer operates at a high or low impedance according to specific operation timing. The CMOS input/output buffers CMOS BUFF 222, 228 are connected to a plurality of latency latch circuits LATENCY LATCH 232, 238, respectively. A mode decoder latch circuit 240 outputs a CAS latency CL and a burst latency BL in response to a mode decoder latch signal MRS generated when the burst mode is set up by a SET command. As the CL and BL are output, a latency control circuit 244 receives a LATCH UPDATE SIGNAL (internal clock) from a control signal for the latency latch circuits 232, 238. The latency latch circuits 232, 238, upon receiving the control signal, writes or reads data corresponding to the CL or BL.

The number of data first-stage circuits, CMOS input/output buffers, latency latch circuits and I/O pads determines the data width of the device 200. Generally, the data is 4-, 8- or 16-bit wide. For example, the device 200 has a data width of 4 bits corresponding to four I/O pads, four data first-stage circuits, of which only two is representatively shown, four CMOS input/output buffers and four latency latch circuits.

The device 200 has a control system circuit 242 that receives from outside a chip selection command CS/, a row address command RAS/, a column address command CAS/, a write enable command WE, a clock CLK and a clock enable CLE and that, according to these commands, generates internal signals. The symbol "/" indicates that the command input cycle is effective when the command input is at low level. According to the command received, the internal control system circuit 242 outputs a mode decoder latch set signal MRS, a signal BCU, a signal BACT/PRE, a signal R/W and a LATCH RENEWAL SIGNAL. The mode decoder latch set signal MRS is a signal to latch an internal address signal in the mode decoder latch 240. The signal BCU is a signal that takes in an address signal during the read or write operation and, in the burst mode, controls the count-up of the Y-latch counter 210. The signal BACT/PRE is for controlling individual banks to make them active and precharge them. The signal R/W is for controlling the read or write operation for individual banks. The LATCH UPDATE SIGNAL is an internal clock signal generated every time the mode decoder latch circuit 238 outputs the CAS latency CL, in order to control the latency control circuit 244.

Referring also to FIG. 9, as stated above, the device 200 has 64M memory cells, one of which is designated by reference numeral 250. The memory cell 250 operates at voltage levels of about 0 V (VSS) and about 2.2 V (VDL). An intermediate voltage VDL/2 represents the midpoint between VSS and VDL, e.g., about 1.1 V. The memory cell 250, along with the remaining memory cells, are grouped into memory banks BANK0–BANK3, each of which includes an X-latch predecoder Xlatch pre-dec, and X-DECODER XDEC, a Y-predecoder YPRE-DEC, a Y-decoder YDEC, memory mats MAT, a sense amplifier circuit SA (see FIG. 10, below), and an I/O selection circuit (see FIG. 11, below). The I/O selection circuit is used to select either connection of disconnection between the local inputs/outputs LIOT, LIOB and the main inputs/outputs MIOB, MIOT.

Figure 10:
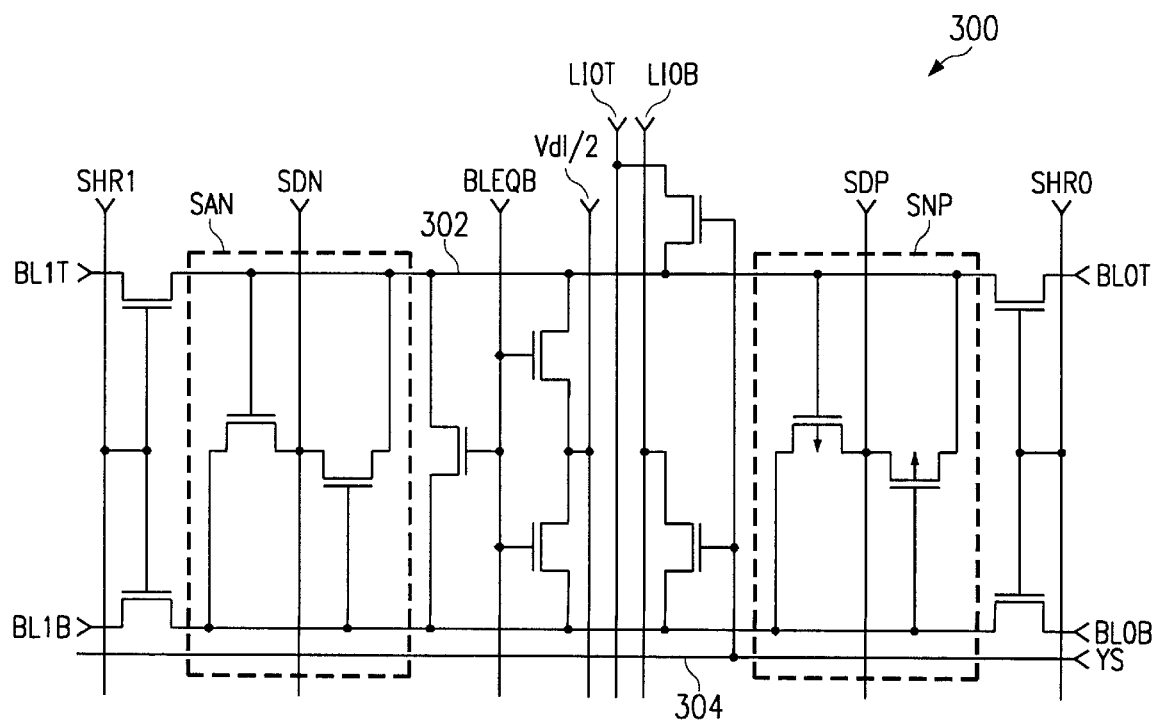
FIG. 10 is a schematic diagram of a circuit of an improved sense amplifier for the 64 Mbit SDRAM of FIG. 8.
Figure 11:
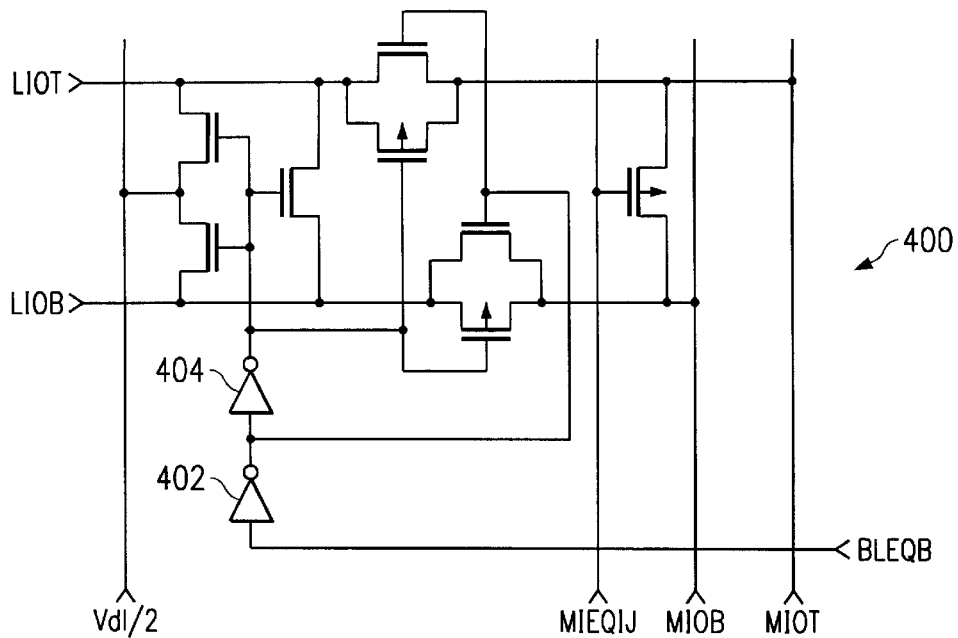
FIG. 11 is a schematic diagram of a circuit of an improved I/O selection circuit for the 64 Mbit SDRAM of FIG. 8.
Figure 12:
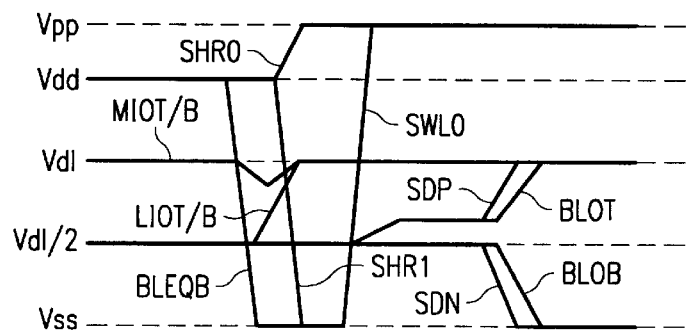
FIG. 12 is a timing diagram of the sense amplifier circuit of FIG. 10 and the I/O selection circuit of FIG. 11 when the memory banks of the 64 Mbit SDRAM of FIG. 8 are active.

Referring to FIGS. 10, 11 and 12, bank-active operations of each circuit is shown when they are precharged. As a bank becomes active, the operation of precharging the nodes of the sense amplifier circuit 300 to the VDL/2 level is ended. That is, the control signal BLEQB goes from a high VDD level to a low VSS level and the precharge MOSFETs in the sense amplifier circuit 300 are turned off to stop the precharge operation, which in turn makes the sense amplifier circuit 300 ready to operate. At the same time, the operation of precharging the local inputs/outputs LIOT, LIOB in the I/O selection circuit 400 to the Vd1/2 level is ended, i.e., the control signal BLEQB goes from a high VDD level to a low VSS level. As a result, the output signals of the inverter circuits 402, 404 turn off the precharge MOSFETs in the I/O selection circuit 400, stopping the precharging of the local inputs/outputs LIOT, LIOB. Thus, the precharging of the local inputs/outputs LIOT, LIOB of the I/O selection circuit 400 is stopped with a time delay of the inverter circuits 402, 404 from the timing when the precharge operation of the sense amplifier circuit 300 is stopped. The control signal BLEQB is also used as a control signal for connecting the local inputs/outputs LIOT, LIOB and the main inputs/outputs MIOT, MIOB to make them ready to operate.

Immediately before the local inputs/outputs LIOT, LIOB and the main inputs/outputs MIOT, MIOB in the I/O selection circuit 400 are connected, the main input/output signals MIOT, MIOB are at the VDL level and the local input/output signals LIOT, LIOB of the sense amplifier circuit 300 and the I/O selection circuit 400 are at the VDL/2 level. When the local inputs/outputs LIOT, LIOB and the main inputs/outputs MIOT, MIOB are connected, the main inputs/outputs MIOT, MIOB go from the VDL level to the VDL/2 level and the local inputs/outputs LIOT, LIOB from the VDL/2 to VDL. As shown in FIG. 2, the write amplifier circuit 20 is connected to the main inputs/outputs MIOT, MIOB. Signal lines MILSB, MILST of the write amplifier circuit 20 connected to the main inputs/outputs MIOT, MIOB are precharged to the VDL level by a precharge circuit WAP connected to the VDL voltage. Thus, the voltage level of the main input/output signals MIOT, MIOB connected to the signal lines MILSB, MILST and to the local input/output signals LIOT, LIOB are equal to the precharge voltage level VDL of the signal lines MILSB, MILST of the write amplifier 20.

When the voltage level of a shared signal SHRO transitions to VPP, which is higher than VDD, bit lines BLOB, BLOT are connected to signal lines 302, 304 of the sense amplifier circuit 300, causing the voltage level difference between the bit lines BLOB and BLOT to appear on the signal lines 302, 304 shown in FIG. 10. An address signal from an external circuit or an address latch counter (FIG. 8) causes the word line SWLO (FIG. 9) to go to the VPP level. After a predetermined time, sense amplifier activation signals SDP, SDN transitions to VDL and VSS levels, respectively, and the voltage level difference between the bit lines BLOB and BLOT is amplified by sense amplifier sections SAN, SNP of the sense amplifier circuit 300. After this, the column selection signal YS is established to write data to or read data from the memory cells.

Figure 13:
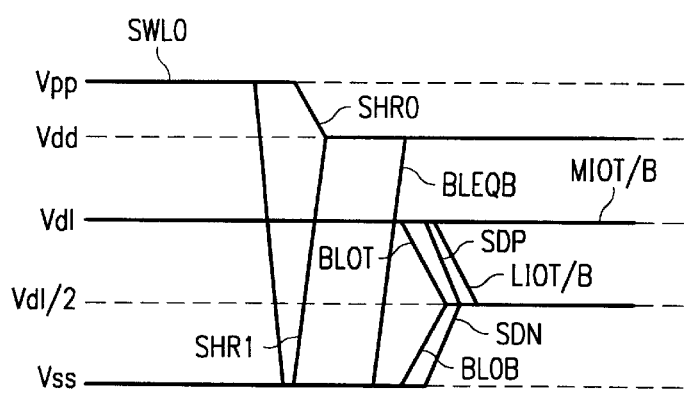
FIG. 13 is a timing diagram of the sense amplifier circuit of FIG. 10 and the I/O selection circuit of FIG. 11 when the memory banks of the 64 Mbit SDRAM of FIG. 8 are being precharged.

Referring to FIGS. 10, 11 and 13, precharge operations for each circuit are shown. After the write or read operation is finished, the word line SWLO transitions from the high VPP level to the low VSS level. When the word line SWLO lowers to the VSS level, the shared control signals SHRO and SHR1 go to the VDD level. Next, when the control signal BLEQB transitions from the low VSS level to the high VDD level, the precharge MOSFETs of the sense amplifier circuit 300 are turned on, precharging the nodes of the sense amplifier circuit 300 to the VDL/2 level.

Figure 14A:
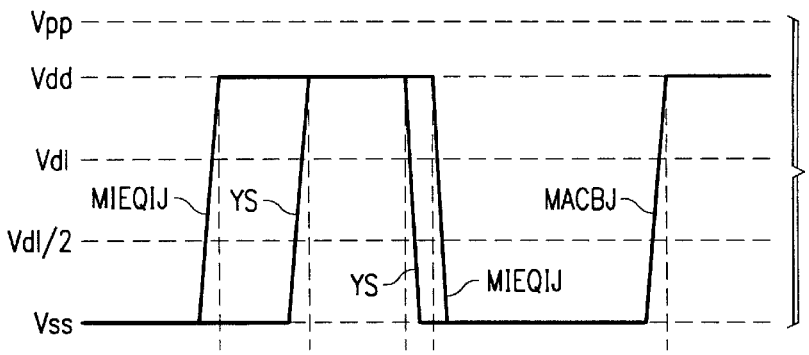
FIG. 14 is a timing diagram of the input signals and output signals during a write operation of the write amplifier circuit
Figure 14B:
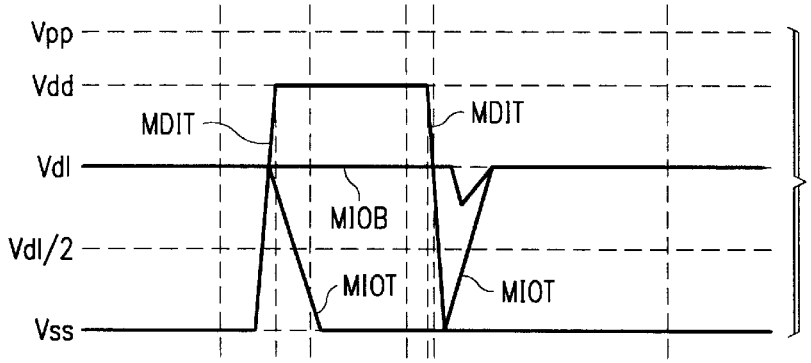
Figure 14C:
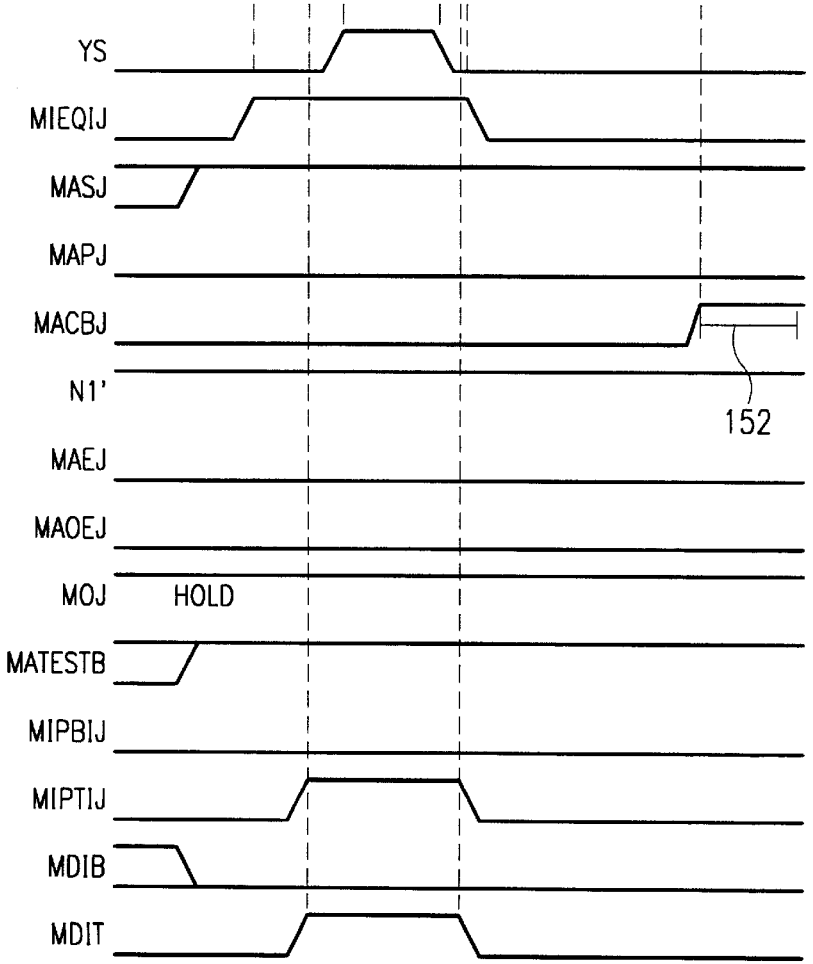

Referring to FIG. 14, the waveforms of the input signals and output signals during the write operations are shown. Circuits WA/MA 246 of the individual banks shown in FIG. 8 each have eight main amplifier circuits and eight write amplifier circuits. The write operations utilize the main amplifier circuit 130 (FIG. 5) and the write amplifier circuit 20 (FIG. 2). The internal control signals, as shown in FIG. 14(a), have a high level of VDD and have a low level of VSS. While the first and second write signals MDIB and MDIT have a high level of VDD and a low level of VSS, the signals written into memory cells, i.e., the main input/output signals MIOT, MIOB, have a high level of VDL and a low level of VSS, as shown in FIG. 14(b). In other words, the write amplifier circuit 20 performs the level changing from VDD to VDL. FIG. 14(c) shows more detailed waveforms when the write operation of FIG. 6 is performed.

Referring also to FIG. 5, when the signal N1', which is synchronous with the main amplifier precharge signal MAPJ, is at a high level in the period 152, the main inputs/outputs MIOT, MIOB are separated from each other on both sides of the PMOSs (a pair of switch MOSFETs Q1 and Q2) which receive the signal N1' at its gates. As a result, the precharge voltage level VDL of one pair (l1, l2) of data lines can be separated from the precharge voltage VDD of the other (m1, m2).

If the MIOT and MIOB are not separated on both sides of the PMOSs (Q1, Q2), the data line pair (l1, l2) transitions to the VDD level because it is lower in voltage level than the data line pair (m1, m2) precharged at the VDD level.

Because the signal lines MIOT, MIOB are separated into the data line pair (l1, l2) and the data line pair (m1, m2) on both sides of the PMOSs (Q1, Q2), it is possible to prevent an unwanted current from flowing due to a short-circuit between the V$_{DL}$ voltage terminal of the write amplifier circuit 20 and the V$_{DD}$ voltage terminal for precharging the data line pair (m1, m2). That is, when the precharging MOSFET driven by the signal MAPJ is on and the PMOSs (Q1, Q2) controlled by the signal N1' are off, unwanted current consumption caused by the short-circuit between the V$_{DD}$ voltage terminal for precharging the data line pair (m1, m2) and the V$_{DL}$ voltage terminal of the write amplifier circuit 20 is prevented.

Referring also to FIG. 15, detailed waveforms of input and output signals during the read operation of the main amplifier circuit 130 are shown. The internal control signals, as shown in FIG. 15(a), have a high level of V$_{DD}$ and have a low level of V$_{SS}$. While the signals read from the memory cells and written into MIOT and MIOB have a high level of V$_{DL}$, the main amplifier output signal MOJ has a high level of V$_{DD}$, as shown in FIG. 15(b). In other words, the main amplifier circuit 130 performs level changing from V$_{DL}$ to V$_{DD}$. FIG. 15(d) shows more detailed waveforms during the read operation shown in FIG. 6.

Figure 15A:
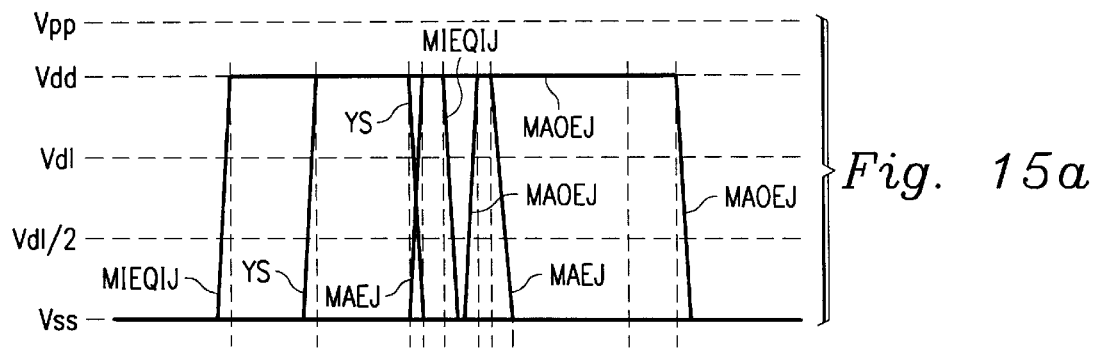
FIG. 15 is a timing diagram of the input signals and output signals during a read operation of the main amplifier circuit of FIG. 5 is performed.
Figure 15B:
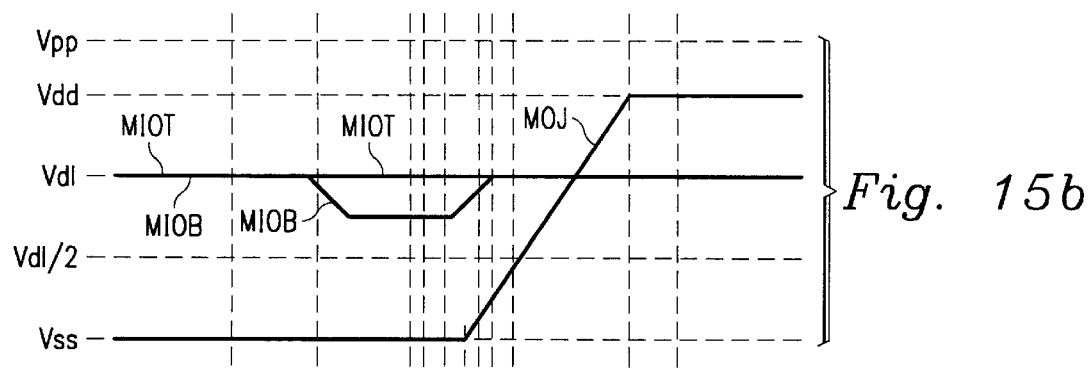
Figure 15C:
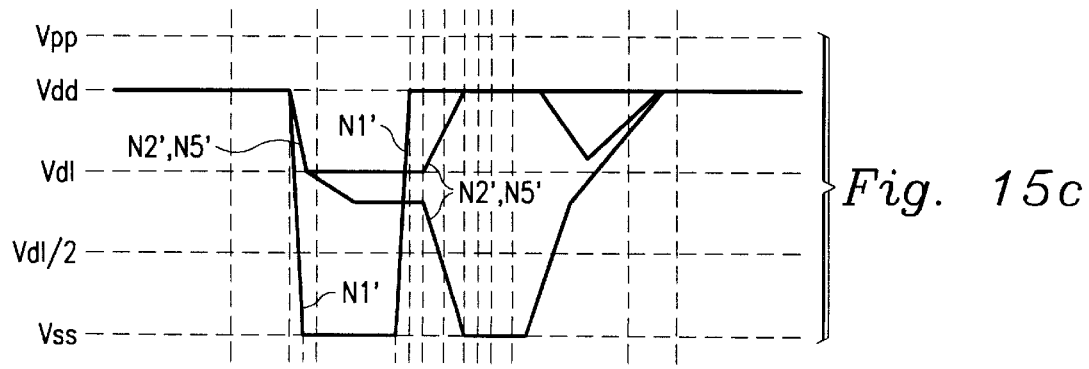

Referring to FIG. 15(c), the signals N1', N2', N5' of the main amplifier circuit 130 have the operation voltage levels of V$_{DD}$ as a high level and V$_{SS}$ as a low level. The signal N1' depends both on a main input/output separation signal MACBJ and a main precharge signal MAPJ when the main amplifier is enabled (MASJ is high), as shown by arrows 144 and 146 in FIG. 15(d).

The data line pairs (l1, l2, m1, m2) can be separated on both sides of the PMOSs (the pair of switch MOSFETs Q1, Q2) whose gate receive the signal N1'. The precharge circuit 134 can precharge one of the data line pairs (l1, l2) to the V$_{DL}$ level and the other data line pair (m1, m2) to the V$_{DD}$ level.

While the signal N1' is low, the data read from memory cells are transferred from one data line pair (l1, l2) to the other data line pair (m1, m2). After this, the read data are amplified by the CMOS latch amplifier circuit (Q3, Q4, Q5, Q6) and then held in the flip-flop circuit 136. When the first and second precharge signals MIPBIJ and MIPTIJ go to a high level while the signal N1' is low, the precharging from the write amplifier circuit 20 to the data line pair (l1, l2) is stopped.

During the precharge period, the PMOSs (Q1, Q2) are off, the signals N5' and N2' are held at the V$_{DD}$ level, which is the precharge level of the data line pair (m1, m2), and thereby a through-current is prevented from flowing in the flip-flop circuit 136 when the voltage levels of the signals N5' and N2' are lowered.

If during the precharge period the data line pairs (l1, l2, m1, m2) are not separated on both sides of the PMOSs (Q1, Q2), the data line pair (m1, m2) precharged to the V$_{DD}$ level and the data line pair (l1, l2) precharged to the V$_{DL}$ level are short-circuited, causing the voltage level of the data line pair (l1, l2) to change to the V$_{DD}$ level. The V$_{DD}$ level, the precharge level of the data line pair (m1, m2), then falls and the lowering of the voltage level of the signals N5' and N2' causes the above-mentioned through-current to flow in the flip-flop circuit 136.

Figure 15D:
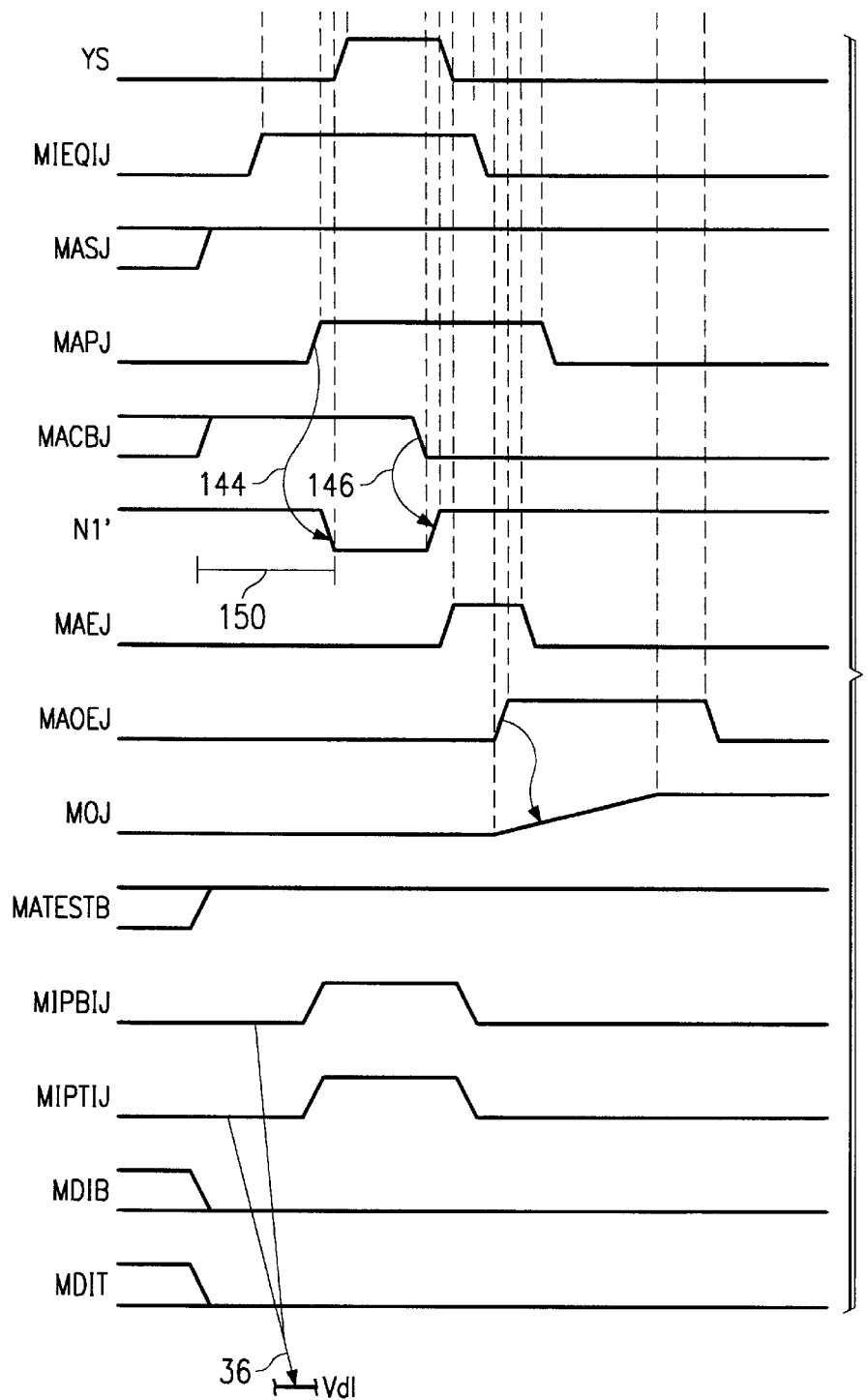

Consequently, as shown in FIG. 15(d), the first and second main precharge signals MIPBIJ and MIPTIJ are held at a low level during the precharge period 150 and the data line pair (l1, l2) on the write amplifier current (FIG. 2) side is precharged to the V$_{DL}$ level. The data line pair (m1, m2) on the CMOS latch amplifier circuit (Q3–Q6) side is precharged to the V$_{DD}$ level as shown in FIG. 15(c). Because the PMOSs (Q1, Q2) for separating the data line pairs (l1, l2, m1, m2) of the precharge circuit 134 are off, a short-circuit is prevented between the data line pair (l1, l2) on the write amplifier circuit side precharged to the V$_{DL}$ level and the data line pair (m1, m2) precharged to the V$_{DD}$ level.

Because the memory array has an internal voltage lower than the external output voltage, the read signal level must be changed from the internal low voltage to the external high voltage. Provision of a new circuit for signal level change results in a lowered read speed because of an additional time taken by the changing circuit. This embodiment, however, performs the voltage level change by dividing the data lines (l1, l, m1, m2) with the switch MOSFETs (Q1, Q2), precharging the data line pair on the inner circuit side to the low voltage and the data line pair (m1, m2) on the amplifier circuit (Q3–Q6) side to the high voltage, and connecting both of the data lines being read. These processes cause no substantial delay due to level changing. Provision of the holding circuit 136 for receiving output signals from the amplifier circuit (Q3–Q6) and holding the data makes it possible to start the precharge operation of the amplifier circuit early in preparation for the next read operation.

Further, the use of the CMOS latch amplifier circuit (Q3–Q6) of FIG. 5 as the amplifier circuit (Q3–Q6) enables a faster readout operation. That is, the level changing in reading causes the signals N2', N5' to change from the V$_{DD}$ level to the V$_{DL}$ level (FIG. 15(c)) and the CMOS latch amplifier circuit (Q3–Q6) rapidly and complementarily amplifies one of the signals to the V$_{DD}$ level and the other to the V$_{SS}$ level.

As explained above, the use of the voltage (V$_{DD}$) higher than the internal supply voltage (V$_{DL}$) as a power supply voltage for the amplifier circuit (Q3–Q6) and the use of the switch MOSFETs (Q1, Q2) for precharging the input data lines of the amplifier circuit to the high voltage (V$_{DD}$) makes it possible to execute the level conversion simultaneously with the operation of the amplifier circuit. This permits a fast reading operation because the delay time due to level changing can be substantially ignored.

Although illustrative embodiments of the present invention have been shown and described, a latitude of modification, change and substitution is intended in the foregoing disclosure, and in certain instances, some features of the invention will be employed without a corresponding use of other features. Furthermore, additional or alternative components and other circuits may be added without altering the scope of the invention. Accordingly, it is appropriate that the appended claims be construed broadly and in a manner consistent with the scope of the invention.

What is claimed is:

1. A semiconductor memory comprising:
    a memory array including a plurality of bit line pairs, a plurality of word lines crossing the bit line pairs, a plurality of dynamic memory cells, and a plurality of sense amplifier circuits connected to the bit line pairs;
    data line pairs to which a predetermined bit line pair of the plurality of the bit line pairs is connected;
    a write circuit connected to the data line pairs to output a first positive voltage level;
    a read amplifier circuit connected to the data line pairs to output a second positive voltage level;
    a pair of switch MOSFETs provided to the data line pairs to divide the data line pairs into a first pair and a second pair;
    a first precharge circuit for precharging the first data line pair to the first positive voltage level; and a second precharge circuit for precharging the second data line pair to the second positive voltage level;

wherein the write circuit is connected to the first data line pair and the read amplifier circuit is connected to the second data line pair;

wherein when the second precharge circuit is in an operating state, the pair of switch MOSFETs are off.

2. A semiconductor memory according to claim 1, wherein the second positive voltage level is higher that the first positive voltage level.

3. A semiconductor memory according to claim 2, wherein the high-level output voltages of the plurality of the sense amplifiers are of the first positive voltage level.

4. A semiconductor memory according to claim 3, wherein the read amplifier circuit is a CMOS latch circuit.

5. A semiconductor memory comprising:

a memory array including a plurality of bit line pairs, a plurality of word lines crossing the bit line pairs, a plurality of word lines crossing the bit line pairs, a plurality of dynamic memory cells, and a plurality of sense amplifier circuits connected to the bit line pairs;

data line pairs to which a predetermined bit line pair of the plurality of the bit line pairs is connected;

a read amplifier circuit connected to the data line pairs;

a pair of switch MOSFETs provided to the data line pairs to divide the data line pairs into a first pair and a second pair;

a first precharge circuit for precharging the first data line pair to a first positive voltage level; and a second precharge circuit for precharging the second data line pair to a second positive voltage level higher than the first positive voltage level;

wherein the predetermined bit line pair is connected to the first data line pair and the read amplifier circuit is connected to the second data line pair;

wherein the power supply voltage of the amplifier circuit is of the second positive voltage level.

6. A semiconductor memory according to claim 5, wherein the read amplifier circuit is a CMOS latch circuit.

7. A semiconductor memory according to claim 6, wherein the high-level output voltages of the plurality of the sense amplifiers are of the first positive voltage level.

8. A semiconductor memory according to claim 7, further comprising a holding circuit for receiving the output signal of the read amplifier circuit, the power supply voltage of the holding circuit is of the second positive voltage level.

9. A semiconductor memory according to claim 8, further comprising a power supply voltage step-down circuit which receives an external power supply voltage to produce the first positive voltage level.

10. A semiconductor memory according to claim 9, further comprising a write circuit which is connected to the data line pairs and outputs the first positive voltage level.

11. A semiconductor memory according to claim 8, wherein when the second precharge circuit is in an operating state, the pair of switch MOSFETs are off.

* * * * *